United States Patent [19]

Katsuo et al.

[11] Patent Number: 4,939,696

[45] Date of Patent: Jul. 3, 1990

[54] SEMICONDUCTOR MEMORY DEVICE

[75] Inventors: Sasaki Katsuo, Fuchuu; Toyoshima Hiroshi, Sagamihara; Hanamura Shoji, Kokubunji; Kubotera Masaaki, Akishima; Komiyazi Kunihiro, Hachioji, all of Japan

[73] Assignees: Hitachi, Ltd., Chiyoda; Hitachi VLSI Engineering Corp., Kodaira, both of Japan

[21] Appl. No.: 225,312

[22] Filed: Jul. 28, 1988

[30] Foreign Application Priority Data

Aug. 28, 1987 [JP] Japan .................................. 62-212823
Jun. 13, 1988 [JP] Japan .................................. 63-145436

[51] Int. Cl.$^5$ ............................................. G11C 11/34
[52] U.S. Cl. ............................ 365/230.03; 365/230.06
[58] Field of Search ....................... 365/230.03, 230.06, 365/190

[56] References Cited

U.S. PATENT DOCUMENTS 4,264,828 4/1981 Perlegos et al. ................ 365/230.06
4,393,472 7/1983 Shimada et al. ............ 365/230.03 X

FOREIGN PATENT DOCUMENTS

184361 10/1982 Japan .
184362 10/1982 Japan .
62-99977 5/1987 Japan .

Primary Examiner—Joseph A. Popek
Attorney, Agent, or Firm—Pennie & Edmonds

[57] ABSTRACT

A semiconductor memory device comprising a decoder circuit for selecting one divided word line from among a plurality of divided word lines; the decoder circuit including a first drive MOSFET which is arranged so as to be shared by a plurality of memory blocks each having the divided word lines with memory cells respectively coupled thereto and which receives signals to be supplied to main word lines, second drive MOSFETs which are respectively coupled to the first MOSFET in series so as to share it and which receive respective predecode signals corresponding to the plurality of divided word lines, a plurality of load means which are respectively coupled to drains of the second drive MOSFETs, and inverter circuits which invert phases of drain output signals of the respective second drive MOSFETs and transmit the inverted signals to the corresponding divided word lines.

8 Claims, 4 Drawing Sheets

SEMICONDUCTOR MEMORY DEVICE

BACKGROUND OF THE INVENTION

The present invention relates to a semiconductor memory device. More particularly, it relates to techniques which are effective when utilized for, e. g., the word line selector circuit of a CMOS static RAM (random access memory).

Figure 6:
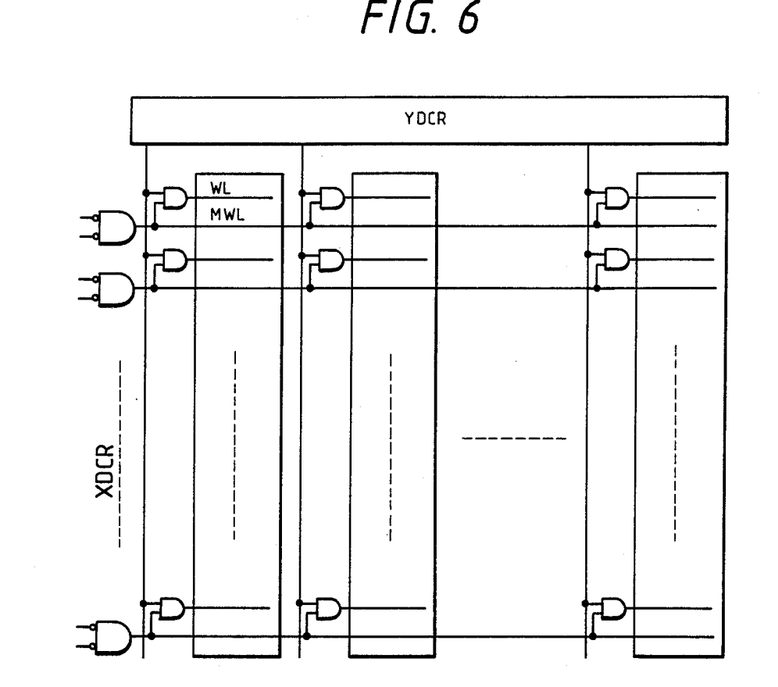
FIG. 6 is a block diagram for explaining a prior-art example.

In a semiconductor memory device, with increase in the storage capacity thereof, a larger number of memory cells are coupled to each word line. Consequently, when one word line has been selected, data is neither read nor written from/into an increased number of memory cells, and the current consumption of the select operation increases. Therefore, for lowering such a consumptive current and for decreasing the number of memory cells to be coupled to each word line, so as to quicken the operation of selecting the word line, it has been known that each word line to which memory cells are coupled is divided as shown in FIG. 6. That is, a main word line MWL is provided with divided word lines WL. Static RAMs furnished with such divided word lines are described in, for example, the official gazette of Japanese Patent Application Laid-open No. 72699/1984 and the official gazette of Japanese Patent Application Laid-open No. 72695/1984.

SUMMARY OF THE INVENTION

When the inventor made studies on the static RAMs mentioned above, problems to be stated below have been revealed: In the static RAM described in the official gazette of Japanese Patent Application laid-open No. 72699/1984, the main word line (pre-word line) MWL and the divided word line WL to which one memory cell is coupled are laid in one-to-one correspondence. It is therefore necessary to arrange, in effect, two word lines (the word lines MWL and WL) for one memory cell. In this manner, the substantial number of word lines doubles geometrically, so that the density of integration is sacrificed.

In this regard, the static RAM described in the official gazette of Japanese Patent Application Laid-open No. 72695/1984 is so constructed that N (two) divided word lines within an identical memory block can be selected through one main word line. In the official gazette, it is explained that the number N is alterable at will. When the number N is enlarged to four or eight, the number of divided word lines which can be selected through one main word line increases, and hence, the substantial number of word lines as viewed from each memory cell can be decreased. With this measure, however, a NAND gate circuit (selector circuit) for selecting one divided word line from among the four or eight divided word lines must have four or eight inputs. When such NAND gate circuits of many inputs are disposed, the occupation area thereof enlarges, and the pitch of the divided word lines is determined by that of the NAND gate circuits, with the result that the density of integration is lowered. In other words, the pitch of the divided word lines becomes greater than that of the memory cells, and a wasteful space appears in the portion of a memory array. In order to achieve a higher density of integration in the memory array, accordingly, the pitch of the divided word lines needs to be set in conformity with the memory cells of the static type consisting of six elements. Besides, in order to select the memory cell through the word line at high speed, the NAND gate circuit needs to be have a comparatively high driving ability. Therefore, the NAND gate circuit becomes at most two or so in the number of its inputs. After all, even with such a technique, the number of word lines increases geometrically, and the problem concerning the density of integration is involved.

An object of the present invention is to provide a semiconductor memory device which realizes a higher density of integration while operating at high speed.

The above and other objects and novel features of the present invention will become apparent from the description of this specification and the accompanying drawings.

A typical aspect of performance of the present invention is briefly summarized as follows: A semiconductor memory device comprises a decoder circuit for selecting one divided word line from among a plurality of divided word lines; said decoder circuit including a first drive MOSFET (insulated-gate field effect transistor) which is arranged so as to be shared by a plurality of memory blocks each having the divided word lines with memory cells respectively coupled thereto and which receives signals to be supplied to main word, or select signal lines, second drive MOSFETs which are respectively coupled to said first MOSFET in series so as to share it and which receive respective predecode signals corresponding to said plurality of divided word lines, a plurality of load means which are respectively coupled to drains of said second drive MOSFETs, and inverter circuits which invert phases of drain output signals of the respective drive MOSFETs and transmit the inverted signals to the corresponding divided word lines. Thus, a unit selector circuit for selecting one divided word line can be, in effect, configured of one drive MOSFET, one load means and one inverter circuit. Therefore, a large number of divided word lines are permitted to be arranged at a high density for each main word line, and a higher density of integration, a higher operating speed and a lower power consumption can be realized.

DESCRIPTION OF THE PREFERRED EMBODIMENTS

Figure 1:
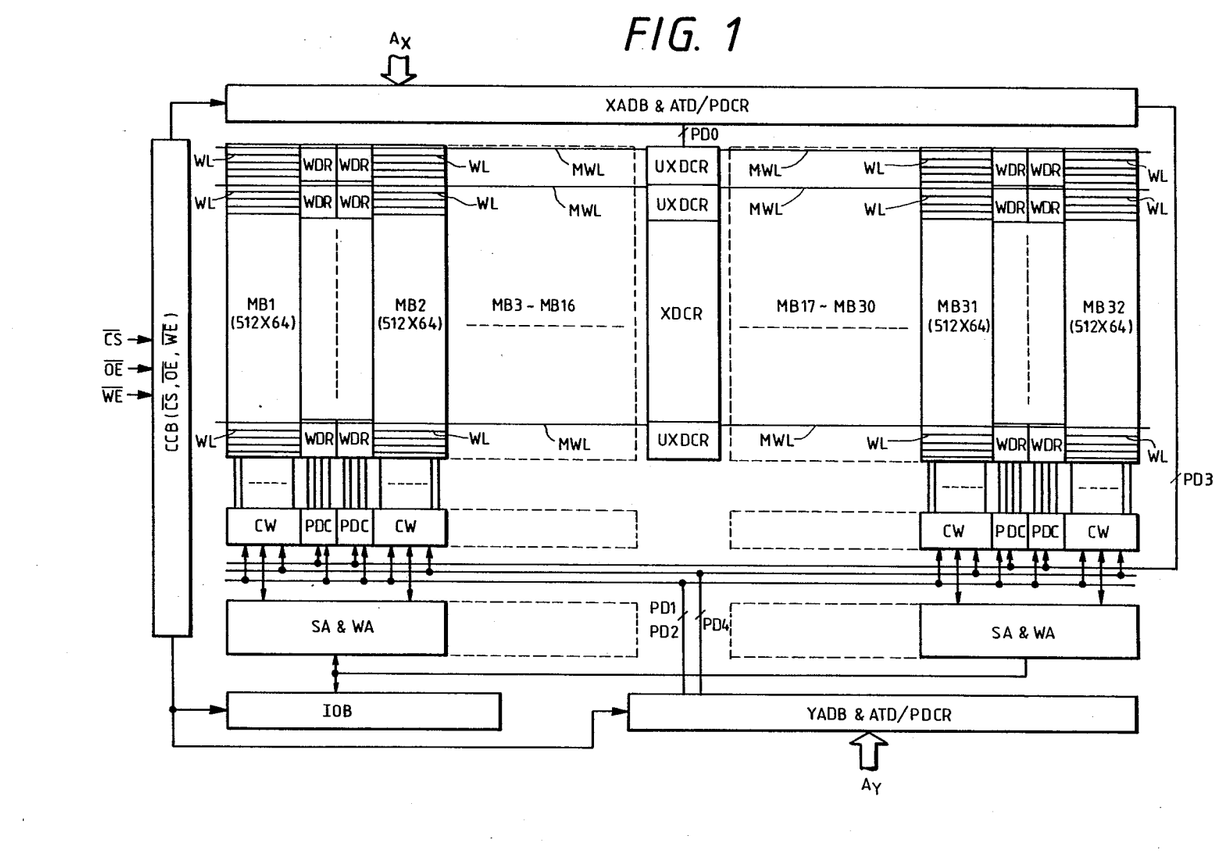
FIG. 1 is a block diagram showing an embodiment of the present invention.

Shown in FIG. 1 is a block diagram of an embodiment of a static RAM (hereinbelow, simply termed "RAM" in some cases) to which the present invention is applied. Various circuit blocks in the figure are formed on a single semiconductor substrate such as of single-crystal silicon by the manufacturing techniques of known semiconductor integrated circuits. Although no special restriction is intended, the principal circuit blocks shown in the figure are depicted in agreement with the actual geometrical arrangement of a semiconductor chip.

An X-address decoder circuit XDCR is arranged centrally of groups of memory blocks (memory mats). The X-address decoder circuit XDCR is constructed of unit decoder circuits UXDCR which are disposed in correspondence with main word lines MWL. That is, the X-decoder circuit XDCR has the unit decoder circuits in a number corresponding to the number of the main word lines. Especially in a case where pads are arranged along the four latera of the chip and where an X-address buffer XADB is extended along the upper longer latus of the chip as illustrated in the figure, it is effective for heightening the operating speed of the RAM that the X-decoder circuit XDCR is located centrally of the memory mats as in this embodiment.

The X-address buffer XADB as stated above is constructed to be unitary with an address signal transition detector circuit ATD and a predecoder PDCR. The X-address buffer XADB receives X-system address signals $A_X$ supplied through external terminals (not shown), and forms complementary internal address signals. The complementary internal address signals are supplied to the predecoder PDCR not shown. Upon receiving the internal address signals, the predecoder PDCR predecodes them and forms predecode signals PD0 and PD3. Although no special restriction is meant, the address signal transition detector circuit ATD not shown receives the complementary internal address signals and forms timing signals to be described later, when the potentials of the X-system address signals have been changed. By way of example, the address signal transition detector circuit ATD is used for forming the timing signal which equalizes pairs of complementary data lines. Incidentally, the X-decoder circuit XDCR is not restricted to the form of a unity, but it may well be constructed of a plurality of divided parts which are arranged at will.

The number of the memory blocks into which the memory area of the RAM is divided, depends upon the magnitude of a memory capacity. In this regard, it is reasonable in view of the allowable current of the chip (RAM) that the number of memory cells which are connected to word lines to-be-selected (divided word lines WL) is 64–128 or so.

Although not especially restricted, this embodiment is so constructed that the number of the memory cells to be connected to the divided word lines WL is set at 64 and that the memory area is divided into 32 mats. In other words, the main word lines MWL are horizontally extended in a manner to be horizontally bisected by the X-decoder XDCR. The main word lines MWL as stated above are laid in common for the divided word lines WL which are laid in each of the memory blocks MB1–MB16 and MB17–MB32 divided in 16. Thus, the word lines are, in effect, divided in 32.

The divided memory blocks have constructions similar to one another. In the figure, four of the memory blocks are typically illustrated. Word decoders WDR are interposed between the memory blocks proximate to each other, such as the memory blocks MB1 and MB2 exemplified in the figure. Each of the word decoder WDR receives a signal transmitted through the main word line MWL and signals from the predecoder PDC to be described later, and it decodes them and selects one divided word line WL within one memory block. In this embodiment, one word decoder WDR selects one divided word line among four divided word lines WL though not especially restricted. Therefore, the four divided word lines are permitted to be selected by one main word line, and the substantial number of word lines which are arranged in the memory block can be decreased to 5 as the total of one main word line and the four divided word lines, for four memory cells. That is, the geometrical number of word lines per row can be made as small as 1.25 on the average. This holds true also of the other memory blocks MB31 and MB32 typically exemplified and the other memory blocks of the word decoder circuits WDR.

Each of the memory blocks has 64 memory cells arranged in the row direction thereof, and is provided with 512 such rows. Therefore, one memory block has a storage capacity of $512 \times 64 = 32768$ bits. Since the whole RAM is configured of the 32 memory blocks, the storage capacity thereof becomes 1048576 (about 1 M) bits.

Referring to the figure, column switch circuits CW, each of which selects a pair of complementary data lines having one of the 64 memory cells coupled thereto, are respectively arranged under the memory blocks MB1 and MB2 typically exemplified. That is, 64 pairs of complementary data lines are coupled to each column switch circuit CW, and from among them, one pair or more pairs of complementary data lines instructed by a column decoder are selected. It is to be understood that the column switch circuit CW includes the column decoder. The word predecoder circuits PDC are arranged under the word decoder circuits WDR.

The pair of complementary data lines selected by the column switch circuit CW are coupled to the input terminals of a sense amplifier SA and the output terminals of a write amplifier WA through a pair of common complementary data lines. The output terminals of the sense amplifier SA are coupled to the input terminals of an output buffer (not shown) which is included in a data input/output buffer IOB, while the input terminals of the write amplifier WA are coupled to the output terminals of an input buffer (not shown) which is included in the data input/output buffer IOB. This data input/output buffer IOB is arranged on the lower side as viewed in the figure in correspondence with the fact that the column-system selector circuits are arranged under the memory blocks as described before.

A Y-address buffer YADB, an address transition detector circuit ATD and a predecoder circuit PDCR are juxtaposed to the input/output buffer IOB so as to extend along the lower longer latus of the chip as shown in the figure.

The Y-address buffer YADB receives the address signals $A_Y$ of a Y-system supplied through external terminals (not shown), and forms the complementary internal address signals of the Y-system. The Y-system complementary internal address signals are decoded by the predecoder PDCR. Predecode signals PD1, PD2 and PD4 are formed by the decode operation. Although not especially restricted, the Y-system complementary internal address signals are supplied to the address transition detector circuit ATD. Thus, when the potentials of the Y-system address signals $A_Y$ have been changed, the address transition detector circuit ATD detects the changes and forms timing signals not shown.

A control buffer CCB receives a chip select signal $\overline{CS}$, an output enable signal $\overline{OE}$ and a write enable signal $\overline{WE}$ through external terminals not shown, and forms several internal operation mode signals.

Next, the operation of the RAM shown in FIG. 1 will be briefly described.

In response to the predecode signal PD0, the X-decoder circuit XDCR selects one pair of right and left main word lines from among the plurality of main word lines at the same time. The word predecoder circuits PDC respond to the predecode signals PD1-PD3, to select one column of word decoders among the 32 columns of word decoders. Accordingly, the word decoder circuit WDR at a position where the selected main word lines MWL and the selected column of word decoders intersect is activated. Thus, one of the four divided word lines WL to be connected to the finally selected main word line MWL through the activated word decoder circuit WDR is selected. Which of the four divided word lines WL is selected, is determined by the four output signals of the pertinent word predecoder circuit PDC. In this way, the 64 memory cells coupled to the selected divided word line are selected. Among them, one or more memory cells are selected by the Y-system selector circuit. As stated before, the complementary internal address signals formed by the Y-system address buffer YADB are supplied to the predecoder circuit PDCR and are once decoded here. The decoded output signals are supplied to the decoder circuit (not shown) included in the column switch circuit SW, so as to connect one or more pairs of complementary data lines to one or more pairs of common complementary data lines. Thus, the RAM is accessed in single-bit or multiple-bit unit. For the brevity of the illustration, the input signals and output signals which are transferred between the input/output circuit IOB and external terminals are omitted from the figure. In addition, each of the address decoders is supplied with the plurality of address signals, but these signals are indicated by a single signal line in the figure.

Figure 2:
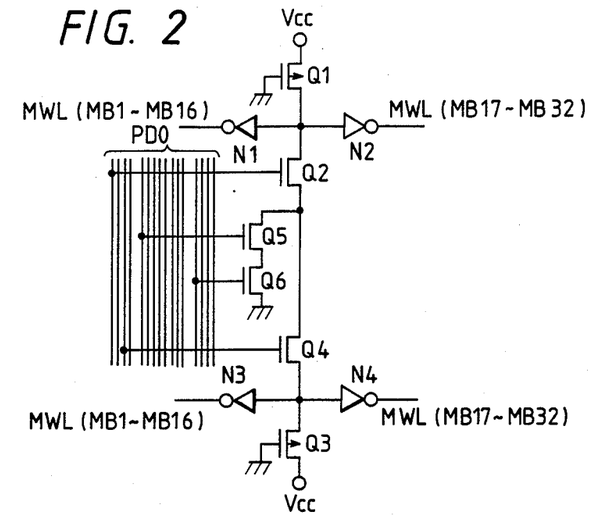
FIG. 2 is a practicable circuit diagram showing an embodiment of the unit circuit (UXDCR) of an X-decoder circuit.

FIG. 2 shows a practicable circuit diagram of an embodiment of the unit decoder circuit UXDCR which constitutes the X-decoder circuit XDCR. It is to be noted, however, that the unit decoder circuit UXDCR shown in the figure corresponds to two of the unit decoder circuits UXDCR in FIG. 1 as will be understood from the ensuing description. In FIG. 2, P-channel MOSFETs Q1, etc. have arrows affixed to their back gates (channels), thereby to be distinguished from N-channel MOSFETs Q2, etc. This holds true also of the succeeding figures.

Although not especially restricted, the integrated circuit is formed on a semiconductor substrate made of N-type single-crystal silicon. Each of the P-channel MOSFETs is configured of a source region and a drain region which are formed in the surface of such a semiconductor substrate, and a gate electrode of, e. g., polycrystalline silicon which is formed on the part of the semiconductor substrate surface between the source region and the drain region through a thin gate insulator film. The N-channel MOSFET is formed in a P-type well region which is formed in the surface of the semiconductor substrate. Thus, the semiconductor substrate constructs a common substrate gate to the plurality of P-channel MOSFETs formed thereon. The P-type well region constructs the substrate gate of the N-channel MOSFET formed thereon.

Of course, it is also allowed to use a semiconductor substrate made of P-type single-crystal silicon and an N-type well region formed therein.

In this embodiment, for the purpose of simplifying circuitry, the single unit circuit UXDCR is constructed so as to select two pairs of main word lines. More specifically, in the case where each memory block has the 512 divided word lines as described before, the 128 main word lines are required because the four divided word lines are selected through one main word line. Accordingly, with a construction wherein one unit decoder circuit UXDCR is provided for one pair of main word lines, the X-decoder circuit XDCR requires 128 unit decoder circuits UXDCR. In contrast, with this embodiment, one unit decoder circuit UXDCR selects two pairs of main word lines as stated above, and hence, the number of the required unit decoder circuits UXDCR can be decreased to 64.

The gates of the N-channel type drive MOSFETs Q5 and Q6 which are disposed in series on the side of the ground potential point of the circuitry are supplied with select signals for selecting one unit decoder circuit from among the 64 unit decoder circuits UXDCR, by the X-system predecoder circuit PDCR. That is, the predecode signals PD0 are combined and are supplied to the respective unit decoder circuits so that one of the 64 unit decoder circuits UXDCR may be selected.

The two drive MOSFETs Q2 and Q4 are disposed so as to share the aforementioned two drive MOSFETs Q5 and Q6. The P-channel MOSFETs Q1 and Q3 as loads are respectively connected to the drains of the drive MOSFETs Q2 and Q4. These P-channel MOSFETs Q1 and Q3 have the ground potential of the circuitry steadily applied to their gates, thereby to be brought into the "on" states thereof. Thus, they function as ariable resistors utilizing their "on" resistances. The drive MOSFET Q2 forms a select signal for selecting one pair of main word lines MWL on the upper side as viewed in the figure, while the drive MOSFET Q4 forms a select signal for selecting one pair of main word lines MWL on the lower side. Therefore, the gate of the drive MOSFET Q2 is supplied with the address signals or predecode signals corresponding to the upper main word lines, while the gate of the drive MOSFET Q4 is supplied with the address signals or predecode signals corresponding to the lower main word lines.

One pair of CMOS inverter circuits N1 and N2 and one pair of CMOS inverter circuits N3 and N4 are respectively connected to the drains of the drive MOSFETs Q2 and Q4. Although each of these CMOS inverter circuits has not its circuit arrangement illustrated, it is configured of a P-channel MOSFET and an N-channel MOSFET which are connected in series between the power source voltage $V_{CC}$ and ground potential of the circuitry, and the gates and drains of which are respectively connected in common so as to construct an input terminal and an output terminal. The output terminals of the inverter circuits N1-N4 are coupled to the respectively corresponding main word lines. In other words, the CMOS inverter circuits N1-N4 construct the drive circuits of the corresponding main word lines.

Subject to the "on" states of the drive MOSFETs Q5 and Q6 and to the "on" state of the drive MOSFET Q2 or Q4 corresponding to the upper or lower main word lines, the drain of the drive MOSFET Q2 or Q4 becomes a low level. Therefore, the output signals of the inverter circuits N1, N2 or N3, N4 receiving the signal of the low level become a high level and bring one pair of main word lines MWL to the select level of the high level. The other main word lines are brought to the non select level of the low level in accordance with the high level of the input signals of the inverter circuits corresponding thereto.

In the X-decoder circuit of this embodiment, a NAND gate circuit (selector circuit) for forming the select signal of one pair of main word lines is not constructed of a CMOS circuit, but it is constructed of a kind of ratio circuit which is configured of the load means made of the P-channel MOSFET and the drive MOSFET made of the N-channel MOSFET. In addition, the unit decoder circuit is provided with the MOSFETs Q5 and Q6 common to the two pairs of main word lines as the drive MOSFETs. Thus, the circuit arrangement of the X-decoder circuit can be simplified, so that the occupation area thereof can be made smaller. Moreover, in the unit decoder circuit, only one MOSFET such as the drive MOSFET Q5 or Q6 or the drive MOSFET Q2 or Q4 is coupled to the line of one predecode signal to be supplied to this unit decoder. It is accordingly possible to reduce parasitic capacitances which are coupled to the individual predecode signal lines for transmitting the predecode signals from the X-system predecoder circuit PDCR to the X-decoder circuit XDCR. Thus, regarding the signals which are transmitted on the predecode signal lines, the mutual switching between the high level and low level thereof can be quickened. That is, the speed of switching from the low level to the high level of the predecode signals, or vice versa, can be heightened.

Figure 3:
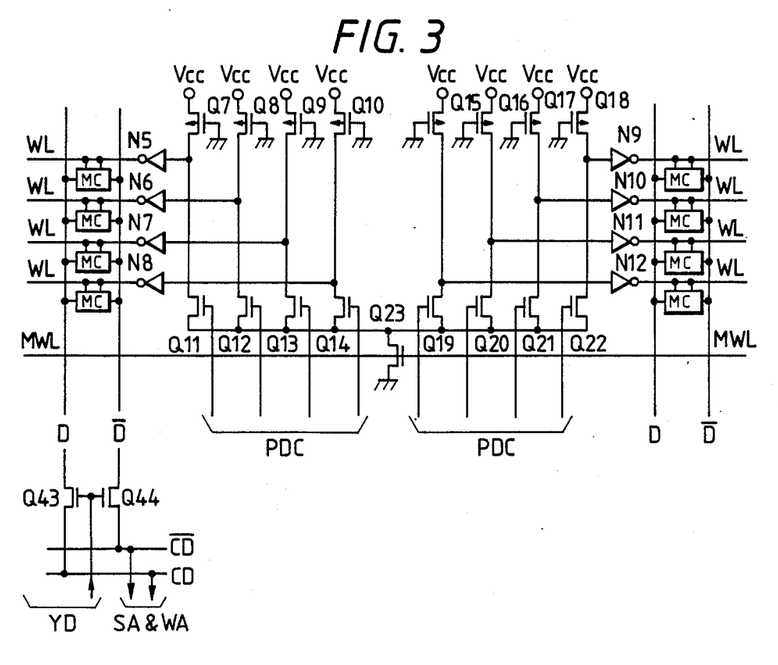
FIG. 3 is a practicable circuit diagram showing an embodiment of a word decoder circuit (WDR)

FIG. 3 shows a practicable circuit diagram of an embodiment of the word decoder circuit WDR which is supplied with the predecode signals from the word predecoder circuit PDC in FIG. 1.

In this embodiment, two word decoder circuits WDR are arranged back to back in correspondence with the embodiment in FIG. 1. More specifically, the word decoder circuit arranged on the left side as viewed in FIG. 3 forms the select signals of the divided word lines of the memory block located on the left side thereof, while the word decoder circuit arranged on the right side forms the select signals of the divided word lines of the memory block located on the right side thereof.

In this embodiment, a common drive MOSFET Q23 is provided for the two word decoder circuits. The gate of the drive MOSFET Q23 is coupled to the main word lines MWL.

Drive MOSFETs Q11 thru Q14, and P-channel type load MOSFETs Q7 thru Q10 similar to the foregoing are connected to the common drive MOSFET Q23 so as to correspond to the respective divided word lines WL of the memory block arranged on the left side. On the other hand, drive MOSFETs Q19 thru Q22, and P-channel type load MOSFETs Q15 thru Q18 similar to the foregoing are connected to the common drive MOSFET Q23 so as to correspond to the respective divided word lines WL of the memory block arranged on the right side.

The drain outputs of the respective drive MOSFETs Q11–Q14 arranged on the left side are supplied to the inputs of CMOS inverter circuits N5 thru N8. The outputs of the respective CMOS inverter circuits N5–N8 are coupled to the corresponding divided word lines WL. Likewise, the drain outputs of the respective drive MOSFETs Q19–Q22 arranged on the right side are supplied to the inputs of CMOS inverter circuits N9 thru N12. The outputs of the respective CMOS inverter circuits N9–N12 are coupled to the corresponding divided word lines WL.

As regards each of the memory blocks which are arranged at the right and left in correspondence with the word decoder circuits, the four divided word lines and one pair of complementary data lines D and $\overline{D}$ are typically exemplified, and memory cells MC are arranged at the intersection points between the divided word lines and the complementary data lines.

The practicable construction of the memory cells MC is not directly pertinent to the present invention and is not illustrated, but the memory cells MC have the same configurations as one another. The memory cell MC includes two storage MOSFETs of the N-channel type, the gates and drains of which are cross-connected to each other and the sources of which are coupled to the ground potential point of the circuitry, and two resistors of high resistance which are made of polycrystalline silicon layers and which are interposed between the drains of the two storage MOSFETs and the power source terminal $V_{CC}$. Transfer gate MOSFETs of the N-channel type are respectively interposed between the common nodes of the gates and drains of the two storage MOSFETs and the complementary data lines D, $\overline{D}$. Thus, the number of elements of one memory cell becomes six in total. The gates of the transfer gate MOSFETs of the memory cells arranged at an identical row are respectively connected in common to the corresponding divided word lines exemplified. The input/output terminals of the memory cells arranged at an identical column are respectively connected to the corresponding pair of complementary data lines (bit lines or digit lines) D and $\overline{D}$ exemplified.

In the memory cell MC, the two storage MOSFETs and the two high-resistance elements construct a kind of flip-flop circuit. However, the operating point of the memory cell in the information retention state thereof is very different from that of a flip-flop circuit in an ordinary sense. More specifically, in the memory cell MC, to the end of lowering the power consumption thereof, one of the high-resistance elements is rendered a remarkably high resistance at such a degree that, while the storage MOSFET connected in series with this high-resistance element is held in the "off" state thereof, the gate voltage of the other storage MOSFET can be maintained at a voltage somewhat higher than the threshold voltage thereof. Likewise, the other high-resistance element is rendered the high resistance. In other words, each of the high-resistance elements is set at a resistance high enough to compensate for a leakage current which flows from the drain of the storage MOSFET, that is, it has a current supplying ability to the extent that information charges accumulated in the gate capacitance of the storage MOSFET are prevented from being discharged.

According to this embodiment, notwithstanding that the RAM is manufactured by the techniques of CMOS semiconductor integrated circuits, the memory cell MC itself is configured of the N-channel MOSFETs and the polycrystalline silicon resistors as described above.

The memory cell and memory array of this embodiment can have their sizes reduced as compared with those in the case of employing P-channel MOSFETs instead of the aforementioned polycrystalline silicon resistors. More specifically, in the case where the polycrystalline silicon resistors are employed, they can be formed on the gate electrodes of the storage MOSFETs, and the sizes of their own can be reduced. Besides, there is not involved the drawback in the case of employing the P-channel MOSFETs that these P-channel MOSFETs must be spaced from the storage MOSFETs with comparatively great distances, so wasteful blank parts can be prevented from appearing on the semiconductor chip.

Incidentally, although no special restriction is intended, equalizing MOSFETs are interposed between the pair of complementary data lines D and $\overline{D}$ and/or between the pair of common complementary data lines CD and $\overline{CD}$. The equalizing MOSFETs, not shown, receive the timing signal formed by the address signal transition detector circuit ATD shown in FIG. 1 and temporarily short-circuit the complementary data lines and/or the common complementary data lines so as to equalize their potentials, thereby to raise the speed of the memory access.

The complementary data lines D and $\overline{D}$ are respectively coupled to the common complementary data lines CD and $\overline{CD}$ through column switching MOSFETs Q43 and Q44 which are typically illustrated in FIG. 3. The column switching MOSFETs are switched and controlled by the output signal of the column decoder or Y-decoder circuit YD which will be described later with reference to FIG. 5.

In FIG. 3, the gates of the drive MOSFETs Q11–Q14 arranged on the left side are respectively supplied with four predecode signals which have been formed by the corresponding word predecoder circuit PDC. Likewise, the gates of the drive MOSFETs Q19–Q22 arranged on the right side are respectively supplied with four predecode signals which have been formed by the corresponding word predecoder circuit PDC.

When the main word line MWL becomes the high level, the drive MOSFET Q23 falls into the "on" state thereof, and any of the four divided word lines WL arranged at this row is selected.

Which of the groups of the divided word lines corresponding to the main word lines is selected, is determined by which of the word predecoder circuits PDC disposed in correspondence with the respective word decoder circuits WDR is activated.

When the word predecoder circuit PDC on the left side as viewed in the figure is activated, the left group of the divided word lines corresponding to the left main word line is selected. In more detail, when one of the four predecode signals, for example, the predecode signal corresponding to the drive MOSFET Q11 is set at the high level, this MOSFET Q11 is brought into the "on" state. Thus, the drain output of the MOSFET Q11 becomes the low level on the side of the ground potential of the circuitry as determined by the ratio between the conductance of the load MOSFET Q7 in the "on" state thereof and the combined conductance of the drive MOSFETs Q11 and Q23 in the "on" states thereof. The CMOS inverter circuit N5 receives this drain output, and brings the corresponding divided word line to the select level of the high level.

On the other hand, when the memory block on the right side in the figure is selected, the word predecoder circuit PDC on the right side is activated, and one of the four predecode signals is set at the high level. Thus, an operation similar to the above proceeds.

By the way, the other predecode signals of the activated word predecoder circuit PDC and the predecode signals of the unselected word predecoder circuit PDC are set at the non-select level such as the low level, and they bring the corresponding drive MOSFETs into the "off" states. Thus, the drain outputs of the corresponding drive MOSFETs are set at the high level by the load MOSFETs of the P-channel type. Since the CMOS inverter circuits respond to the high level and form the output signals of the low level, the divided word lines to be brought into non-selected states become the non-select level of the low level.

In the word decoder circuit WDR of this embodiment, a NAND gate circuit (selector circuit) for selecting one divided word line is not constructed of a CMOS circuit, but it is constructed of the ratio circuit which is configured of the load means made of the P-channel MOSFET and the drive MOSFET made of the N-channel MOSFET. In addition, the drive MOSFET Q23 corresponding to the main word lines is shared by the two word decoder circuits. Thus, the circuit arrangement of the word decoder circuit can be simplified, so that the occupation area thereof can be made smaller. That is, the elements to be disposed per divided word line are, in effect, four elements which consist of one drive MOSFET, one load MOSFET, and the two elements of the CMOS inverter circuit. Thus, the circuit per divided word line can be constructed with substantially the same occupation area as that of the memory cell MC which consists of the six elements as stated before, and the pitch of the divided word lines and that of the word decoder circuits to be disposed in correspondence therewith can be brought into agreement. Accordingly, a higher density of integration can be realized while the system in which the word lines are divided is adopted. Moreover, in one unit word decoder circuit WDR, only one MOSFET is coupled to one predecode signal line. It is accordingly possible to reduce parasitic capacitances which are coupled to the individual predecode signal lines for transmitting the predecode signals from the word predecoder circuit PDC to the word decoder circuit WDR. This fact makes it possible to quicken the mutual switching between the high level and the low level, namely, to raise the speed of switching from the low level to the high level of the predecode signals, or vice versa.

Figure 4:
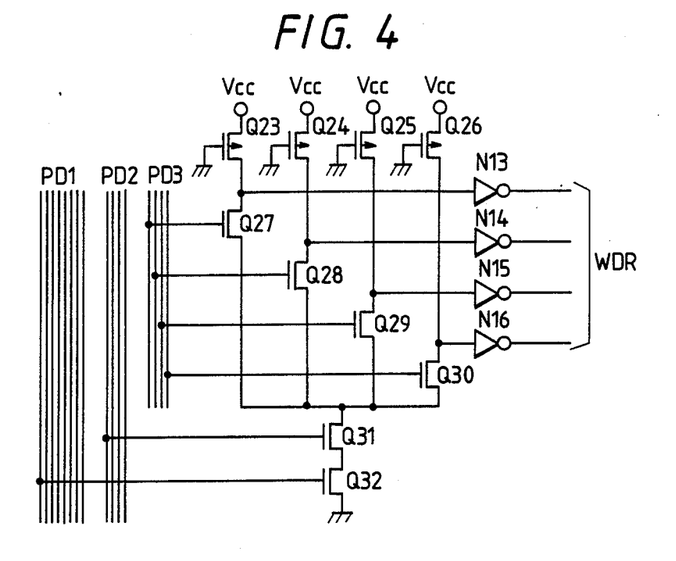
FIG. 4 is a practicable circuit diagram showing an embodiment of a word predecoder circuit PDC.

FIG. 4 shows a practicable circuit diagram of an embodiment of the word predecoder circuit PDC.

In this embodiment, drive MOSFETs Q27 thru Q30 which form the predecode signals to be supplied to the word decoder circuit WDR and load MOSFETs Q23 thru Q26 of the P-channel type which are similar to the foregoing are disposed so as to share drive MOSFETs Q31 and Q32 which are connected in series. The drain outputs of the respective drive MOSFETs Q27–Q30 are supplied to the inputs of CMOS inverter circuits N13 thru N16. The output signals of the respective CMOS inverter circuits N13–N16 are used as the predecode signals which are supplied to the word decoder circuit WDR through the predecode signal lines.

The gates of the drive MOSFETs Q31 and Q32 are respectively supplied with the predecode signals PD1 and PD2 which have been formed by decoding the Y-system address signals for designating a desired memory block among the 32 memory blocks. That is, both the drive MOSFETs Q31 and Q32 are brought into the "on" states thereof, whereby one predecoder circuit PDC among the predecoder circuits PDC in the total number of 32 is activated. The remaining predecode signals PD3 are supplied to the gates of the drive MOSFETs Q27–Q30, thereby to form one predecode signal. Since the predecode signals PD3 are signals for designating one of the four divided word lines, they are formed by decoding the X-system address signals by means of the X-system predecoder circuit PDCR.

Which of the four drive MOSFETs Q27–Q30 is brought into the "on" state thereof, is determined by which of the predecode signals PD3 is activated. By way of example, if the predecode signal corresponding to the drive MOSFET Q27 is at the high level, this MOSFET Q27 falls into the "on" state. Thus, the drain output of the MOSFET Q27 is brought to the low level on the side of the ground potential of the circuitry as determined by the ratio between the conductance of the load MOSFET Q23 of the P-channel type in the "on" state thereof and the combined conductance of the drive MOSFET Q27 and the drive MOSFETs Q31 and Q32 in the "on" states thereof. The CMOS inverter circuit N13 receives the low-level drain output, and brings to the high level the corresponding predecode signal to be supplied to the word decoder circuit WDR.

Regarding each of the other output signals of the activated word predecoder circuit PDC and the output signals of the inactive word predecoder circuits PDC, at least one of the three drive MOSFETs which are, in effect, connected in series is held in the "off" state thereof, and hence, the drain output of the drive MOSFET corresponding to the output signal is rendered the high level by the P-channel type load MOSFET. In response to the high-level drain output, the CMOS inverter circuit forms the output signal of the low level, so that the predecode output signal becomes the non-select level of the low level.

In the word predecoder circuit PDC of this embodiment, a NAND gate circuit (selector circuit) for forming one predecode signal is not constructed of a CMOS circuit, but it is constructed of the ratio circuit which is configured of the load means made of the P-channel MOSFET and the drive MOSFET made of the N-channel MOSFET. In addition, the two drive MOSFETs Q31 and Q32 which activate the word predecoder circuit corresponding to one word decoder circuit (one memory block) are shared by the four selector circuits which form the four predecode signals to be supplied to the word decoder circuit WDR. Thus, the circuit arrangement of the word predecoder circuit can be simplified, so that the occupation area thereof can be made smaller. Moreover, in one word predecoder circuit, only one MOSFET is coupled to the line of one input signal to be supplied thereto. It is accordingly possible to reduce parasitic capacitances which are coupled to the individual output lines (predecode signal lines) of the predecoder circuits PDCR that are respectively constructed to be unitary with the address buffers XADB and YADB. This fact makes it possible to quicken the mutual switching between the high level and the low level, namely, to raise the speed of switching from the low level to the high level of the predecode signals PD1–PD3, or vice versa.

Figure 5:
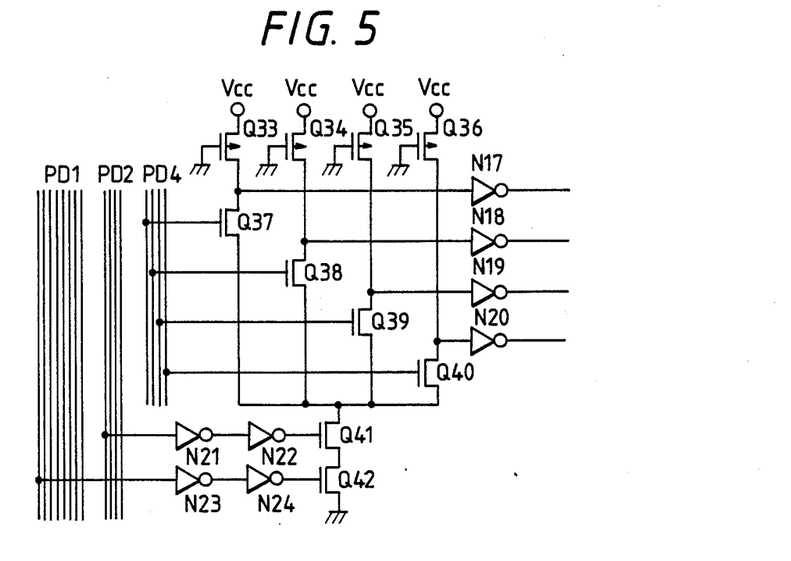
FIG. 5 is a practicable circuit diagram showing an embodiment of a Y-decoder circuit.

FIG. 5 shows a practicable circuit diagram of an embodiment of the Y-decoder circuit YD which is built in the column switch circuit CW.

The circuit of this embodiment is fundamentally similar in arrangement to the circuit in FIG. 4. Drive MOSFETs Q37 thru Q40 for forming the column select signals, and load MOSFETs Q33 thru Q36 of the P-channel type similar to the foregoing are disposed so as to share drive MOSFETs Q41 and Q42 which are connected in series with each other. In addition, the drain outputs of the respective drive MOSFETs Q37–Q40 are supplied to the inputs of CMOS inverter circuits N17 thru N20. The output signals of the respective CMOS inverter circuits N17–N20 are used as the select signals which are supplied to the gates of the transfer gate MOSFETs (for example, the transfer gate MOSFETs Q43 and Q44 shown in FIG. 3) constituting the column switches.

In this embodiment, select signals to be supplied to the gates of the drive MOSFETs Q41 and Q42 are respectively supplied through a delay circuit consisting of CMOS inverter circuits N21 and N22 and a delay circuit consisting of CMOS inverter circuits N23 and N24. Each of these inverter circuits N21–N24 is such that the sizes (W/L) of a P-channel MOSFET and an N-channel MOSFET constituting it are set to be small. The reason why such CMOS inverter circuits N21–N24 for affording delays are disposed, is that the margin of a write timing is secured. More specifically, the predecode signals to be supplied to the gates of the drive MOSFETs Q37–Q40 should preferably be set slow for the purpose of securing the margin of the write timing. In conformity with this situation, the input signals to be supplied to the drive MOSFETs Q41 and Q42 need to be delayed, so that the CMOS inverter circuits N21–N24 are disposed.

In this embodiment, as the predecode signals which determine one Y-decoder circuit YD to be activated among the plurality of Y-decoder circuits YD, the Y-system predecode signals PD1 and PD2 are employed as in the predecoder circuit PDC shown in FIG. 4. Which of the four output signals of the activated Y-decoder circuit YD is rendered the select signal, is determined by the predecode signals PD4 which have been formed by predecoding the Y-system address signals.

In the Y-decoder circuit YD of this embodiment, likewise to any other selector circuit stated before, a NAND gate circuit (selector circuit) for forming one decode signal is not constructed of a CMOS circuit, but it is constructed of a ratio circuit which is configured of the load means made of the P-channel MOSFET and the drive MOSFET made of the N-channel MOSFET. In addition, as the common drive MOSFETs, the two drive MOSFETs Q41 and Q42 are shared for producing the four outputs. Thus, the circuit arrangement of the Y-decoder circuit can be simplified, so that the occupation area thereof can be made smaller. Moreover, in one decoder circuit, only one MOSFET is coupled to the line of one input signal to be supplied thereto. Besides, the delaying inverter circuits N21 and N23 have the sizes (W/L) of the constituent MOSFETs set small, so that the input gate capacitances thereof can be reduced. It is accordingly possible to reduce parasitic capacitances which are coupled to the individual output lines (predecode signal lines) of the predecoder circuits PDCR that are respectively constructed to be unitary with the address buffers XADB and YADB. This fact makes it possible to quicken the mutual switching between the high level and the low level, namely, to raise the speed of switching from the low level to the high level of the predecode signals PD1, PD2 and PD4, or vice versa.

As understood from the above description, the word decoder circuit, X-decoder circuit, word predecoder circuit and Y-decoder circuit are not constructed of CMOS circuits, but they are constructed of the ratio circuits. Therefore, these circuits have a kind of voltage conversion function, and the voltage values of their output signals differ from those of their input signals.

Meanwhile, the RAM in FIG. 1 has its various MOSFETs formed using the 0.8 $\mu$m process (in which the typical value of gate lengths is 0.8 μm). In the decoder circuits shown in FIGS. 2 thru 5, however, the gate lengths of the load MOSFETs of the P-channel type are set at 1.0–2.0 μm as a measure against hot carriers, and those of the N-channel MOSFETs of the outputting CMOS inverter circuits are set at 1.0–1.4 μm. In this manner, the channel lengths of the MOSFETs through which currents normally flow D.C.-wise are made greater as compared with those of the other MOSFETs as described above, whereby the degradations of characteristics attributed to the hot carriers can be prevented, and a satisfactory reliability can be attained.

Functional effects which are produced by the foregoing embodiments are as follows:

(1) A first drive MOSFET which is arranged so as to be shared by a plurality of memory blocks each including divided word lines with memory cells respectively coupled thereto and which receives signals of main word lines, second drive MOSFETs which are respectively connected in series with the first drive MOSFET so as to share it and which receive respective predecode signals corresponding to the plurality of divided word lines, and load means which are coupled to the drains of the respective second drive MOSFETs, are used to construct a decoder circuit for selecting one divided word line from among the plurality of divided word lines, the respective drain output signals of the second drive MOSFETs being transmitted to the divided word lines through inverter circuits. With this construction, a unit selector circuit for selecting one divided word line can be virtually configured of one drive MOSFET, one load MOSFET and one inverter circuit. Therefore, the invention brings forth the effect that a large number of divided word lines can be arranged at a high density for each main word line, and a higher density of integration is permitted.

(2) Since, owing to the above item (1), a system in which word lines are divided can be adopted, the loads of the word lines can be relieved, and hence, the word lines can be switched quickly. This brings forth the effect that a higher operating speed is permitted.

(3) Owing to the above item (1), the division of word lines makes it possible to diminish the number of memory cells which are coupled to one divided word line to be selected. This brings forth the effect that a lower power consumption can be realized.

(4) A unit decoder circuit is not constructed using a CMOS circuit, but it is constructed of load means made of a P-channel MOSFET and a drive MOSFET made of an N-channel MOSFET. In one unit decoder circuit, therefore, only one MOSFET may be coupled to the line of one input signal to be supplied thereto. Accordingly, the parasitic capacitances of the input signal lines can be lowered. Thus, regarding the input signals which are transmitted on the input signal lines, the mutual switching between the high level and low level of the input signals can be quickened, that is, the speed of switching from the low level to the high level of the input signals, or vice versa, can be heightened. Conjointly with the effect (1), this brings forth the effect that a still higher operating speed can be achieved.

(5) There is adopted a construction in which, as a drive MOSFET or drive MOSFETs constituting a decoder circuit, one or more drive MOSFETs common to a plurality of output signals is/are employed. This brings forth the effect that the circuit arrangement of the decoder circuit can be simplified.

Although, in the above, the invention made by the inventor has been concretely described in conjunction with embodiments, it is needless to say that the present invention is not restricted to the foregoing embodiments, but that it can be variously altered within a scope not departing from the purport thereof. By way of example, in the circuits of the embodiments in FIGS. 2 thru 5, appropriate bias voltages may well be applied to the gates of the load MOSFETs of the P-channel type. Besides, such P-channel MOSFETs may well be replaced with appropriate resistance means made of polycrystalline silicon layers or the likes. In the case of employing the polycrystalline silicon resistors in this manner, a region where the P channel type load MOSFET is formed and a P-type well region where the N-channel type drive MOSFET is formed need not be spaced so as to have a proper distance, and hence, a still higher density of integration is permitted likewise to that of the memory cells employing the high resistance elements of polycrystalline silicon as described before. In addition, the memory cell may well be one of the complete CMOS static type which consists of an N-channel MOSFET and a P-channel MOSFET. Alternatively, the memory cell may well be one in which the polycrystalline silicon layers of high resistance are replaced with P-channel MOSFETs made of polycrystalline silicon. Further, the number of the divided word lines may well be increased to eight or more per main word line. Even in the case of increasing the number of the divided word lines in this manner, when the number of predecode signals is set at eight, the number of selector circuits each being provided in correspondence with one divided word line can be made the small number of 4 as in the case of four predecode signals; when the number of predecode signals is set at four, the number of selector circuits can be made the small number of 5; and so forth. Therefore, the word decoder circuits can be arranged at a high density. Moreover, various aspects of performance can be adopted as the arrayals of the memory blocks and the several sorts of decoder circuits.

The present invention is extensively applicable, not only to the static RAM as described above, but also to multifarious semiconductor memory devices such as dynamic RAMs and a variety of programmable ROMs (read only memories) as well as a masked ROM. The RAMs and the ROMs may well be built in digital integrated circuits such as microcomputers.

Effects which are attained by a typical aspect of performance of the present invention are briefly explained as follows: A first drive MOSFET which is arranged so as to be shared by a plurality of memory blocks each including divided word lines with memory cells respectively coupled thereto and which receives signals of main word lines, second drive MOSFETs which are respectively connected in series with the first drive MOSFET so as to share it and which receive respective predecode signals corresponding to the plurality of divided word lines, and load means which are coupled to the drains of the respective second drive MOSFETs, are used to construct a decoder circuit for selecting one divided word line from among the plurality of divided word lines, the respective drain output signals of the second drive MOSFETs being transmitted to the divided word lines through inverter circuits. With this construction, a unit selector circuit for selecting one divided word line can be virtually configured of one drive MOSFET, one load MOSFET and one inverter circuit. Therefore, a large number of divided word lines can be arranged at a high density for each main word line, and a higher density of integration, a higher operating speed and a lower power consumption can be realized.

What is claimed is:

1. A semiconductor memory device comprising:
   a plurality of memory blocks each of which includes a plurality of word lines having memory cells coupled thereto, respectively,
   a select signal line which is connected to said plurality of memory blocks,
   first selection means coupled to said plurality of word lines and said select signal line, and for selecting at least one word line from among said plurality of word lines, and
   second selection means coupled to said select signal line and said first selection means, and for supplying select signals thereto,
   wherein said first selection means includes first variable resistance means having its conductivity varied by the select signal from said select signal line, a plurality of load means, a plurality of second variable resistance means coupled between the respective load means and said first variable resistance means and having their conductivities varied by the select signals supplied from said second selection means, and a plurality of coupling means coupled between said second variable resistance means and said plurality of word lines.

2. A semiconductor memory device according to claim 1, wherein said first variable resistance means is constructed of a MISFET of one conductivity type, each of said second variable resistance means is constructed of a MISFET of said one conductivity type, and each of said load means is constructed of a MISFET of a conductivity type opposite to said one conductivity type.

3. A semiconductor memory device according to claim 2, wherein each of said coupling means is phase inversion means.

4. A semiconductor memory device according to claim 3, wherein said phase inversion means is an inverter circuit.

5. A semiconductor memory device according to claim 4, wherein each of said memory cells includes a flip-flop circuit.

6. A semiconductor memory device comprising a plurality of memory blocks each of which includes divided word lines having memory cells coupled thereto, respectively, and a plurality of word decoder circuits each of which includes a first drive MOSFET receiving a signal of a main word line, second drive MOSFETs, the source of each of said second drive MOSFET, connected to the drain of said first drive MOSFET, each second drive MOSFET receiving a predecode signal corresponding to a divided word line, respectively, a plurality of load means connected to drains of the respective second drive MOSFETs, and inverter circuits receiving drain outputs of the respective second drive MOSFETs so as to drive the corresponding divided word lines.

7. A semiconductor memory device according to claim 6, wherein two of said word decoder circuits are arranged between one pair of memory blocks among said plurality of memory blocks, said first drive MOSFET drain is connected to the source output of each said second decode circuit second drive MOSFET, and said second drive MOSFETs of each of said two word decoder circuits receive the predecode signals corresponding to either of the right and left memory blocks.

8. A semiconductor memory device according to claim 7, wherein said drive MOSFETs which constitute said each word decoder circuit are N-channel MOSFETs, and said plurality of load means are respectively made of P-channel MOSFETs which are steadily brought into "on" states thereof.

* * * * *

UNITED STATES PATENT AND TRADEMARK OFFICE
CERTIFICATE OF CORRECTION

PATENT NO. : 4,939,696

DATED : July 3, 1990

INVENTOR(S) : Sasaki et al

It is certified that error appears in the above-identified patent and that said Letters Patent is hereby corrected as shown below:

At the top of the patent, item [19], change "Katsuo et al" to --Sasaki et al--.

Please change at [75] "Inventors:" the names from

"Sasaki Katsuo"
"Toyoshima Hiroshi"
"Hanamura Shoji"
"Kubotera Masaaki"
"Komiyazi Kunihiro"    to --Katsuro SASAKI--
--Hiroshi TOYOSHIMA--
--Shoji HANAMURA--
--Masaaki KUBOTERA--
--Kunihiro KOMIYAZI--

Signed and Sealed this

Twelfth Day of November, 1991

Attest:

HARRY F. MANBECK, JR.

*Attesting Officer*　　　　*Commissioner of Patents and Trademarks*